United States Patent [19]

Myers

[11] Patent Number: 5,278,841
[45] Date of Patent: Jan. 11, 1994

[54] METHOD AND APPARATUS FOR DIAGNOSING NET INTERCONNECT FAULTS USING ECHO PULSED SIGNALS

[75] Inventor: Donna C. Myers, Kingston, N.Y.

[73] Assignee: International Business Machines Corporation, Armonk, N.Y.

[21] Appl. No.: 785,382

[22] Filed: Oct. 30, 1991

[51] Int. Cl.$^5$ ............................................. G06F 11/00
[52] U.S. Cl. ................................... 371/20.6; 371/57.2; 371/22.2; 324/527
[58] Field of Search ....................... 371/25.1, 34, 20.6, 371/57.2, 22.1, 22.2, 22.3, 15.1; 324/534, 537, 527; 307/465, 465.1

[56] References Cited

U.S. PATENT DOCUMENTS

| | | | |
|---|---|---|---|
| 4,009,437 | 2/1977 | Lacher | 324/72.5 |
| 4,395,767 | 7/1983 | Van Brunt et al. | 371/25.1 |
| 4,625,311 | 11/1986 | Fitzpatrick et al. | 371/22.2 |
| 4,651,088 | 3/1987 | Sawada | 324/22.1 |
| 4,656,632 | 4/1987 | Jackson | 371/27 |
| 4,991,174 | 2/1991 | Mori et al. | 371/15.1 |

OTHER PUBLICATIONS

IBM Technical Disclosure Bulletin, vol. 21, No. 2, Jul. 1978, "Shorts Diagnosis Using Logic Test Data", pp. 503–508, Babiel et al.
IBM J. Res. Develop., vol. 34, No. 2/3, Mar./May 1990, "Boundary Scan Design Principles for Efficient LSSD ASIC Testing", Bassett et al.
1988 International Test Conference, paper 7.1, "Testing and Diagnosis of Interconnects using Boundary Scan Architecture", Hassan et al.
1988 International Test Conference, paper 7.3, "Design for Testability for Wafer-Scale Integration Interconnect Systems Design & Test Methodology", M. Gruetzner.
1987 International Test Conference, paper 30.2, "Testing a Board with Boundary Scan", Dirk van de Lagemaat et al.
1987 International Test Conference, paper 2.2, "Interconnect Testing with Boundary Scan", Wagner.
1987 International Test Conference, paper 30.1, "Boundary-Scan: A Framework for Structured Design-For-Test", Maunder et al.

Primary Examiner—Kevin J. Teska
Assistant Examiner—Jae H. Choi
Attorney, Agent, or Firm—Floyd A. Gonzalez; Robert L. Troike

[57] ABSTRACT

System speed boundary tests are made on nets interconnecting field programmable logic without any external testing equipment or special printed circuit board layout for such a test. Only a single net interconnecting all field programmable logic in a ring is employed. The tests are made for opens and shorts and localize faults to a particular net. Nets interconnecting field programmable logic are tested utilizing the information stored in the circuit design file and the reprogrammability of the field programmable logic to construct a circuit that is then implemented in the field programmable logic and tests all interconnecting nets.

6 Claims, 10 Drawing Sheets

METHOD AND APPARATUS FOR DIAGNOSING NET INTERCONNECT FAULTS USING ECHO PULSED SIGNALS

BACKGROUND OF THE INVENTION

1. Field of the Invention

The present invention generally relates to a method and apparatus for performing automatic tests on a printed circuit board (PCB) or card and, more particularly, to a network test circuit and method that utilizes a unique pulse and sequential count to detect and locate opens and shorts on card networks.

2. Description of the Prior Art

The IEEE (Institute of Electronics and Electrical Engineers) 1149 standard addresses the growing demand for a means of performing in-circuit testing. The standard provides several important functions: external network (net) testing, internal functional testing, and a sample mode. The external testing provides a means for testing for opens and shorts on printed circuit board (PCB) or card networks. The other two functions provide a means for testing the function of the chip itself.

The IEEE standard proposes a four pin interface which each chip should provide. The four pins are a mode pin, a scan-in pin, a scan-out pin, and a pin for the test clock. The IEEE standard also defines a boundary circuit which each chip should provide at every input/output (I/O). This boundary circuit is where the testing takes place.

The operation of a boundary scan is fairly straight forward. In a system, the scan-out and scan-in pins for the chips are connected so that the boundary scan latches in those chips form a ring. The test patterns for the chips are then scanned into the output boundary latches. The pattern of "1s" and "0s" is held at these output latches while the input boundary latches receive the result. The resulting pattern is then scanned out of the input boundary latches and compared to the expected result. If the expected pattern differs from the received pattern, a problem exists. All tests and result gathering are conducted at the test speed provided by the test clock.

In practice, the boundary scan technique is much more complicated than described above, and considerable research has been and continues to be devoted to test pattern generation, fault isolation, and fault detection. However, the foregoing description should provide a basic understanding of how the boundary scan technique works.

The IEEE 1149 standard led to a flurry of activity in boundary scan techniques. One area of particular concentration is pattern generation; i.e., what is a good set of test patterns to scan into the boundary registers? At the 1988 International Test Conference, Abu Hassan et al. presented a paper entitled "Testing and Diagnosis of Interconnects Using Boundary Scan Architecture" which describes a walking sequence test pattern. The walking sequence consists of a pattern, for example a logic "1", which is scanned through the boundary latches. In the case of the walking "1" pattern, a logic "1" is shifted into the first output boundary register, the test is begun, and the input boundary registers latch in the result. The resulting pattern is shifted out and the number of logic "1s" is counted. If the number of logic "1s" received is too few or too many, a faulty net exists. The walking sequence test pattern may be used to detect OR-shorts, stuck-on-one (S-A-1) faults, AND-shorts, and stuck-on-zero (S-A-0) faults. The walking sequence has the advantages that it is easy to use and very time efficient.

Matthias Gruetzner, in "Design for Testability for Wafer-Scale Integration Interconnect Systems Design and Test Methodology", *Proceedings of the 1988 International Test Conference*, 1988, pp. 146-152, describes an echoregister circuit. This circuit receives the results from a boundary test, then "echoes" them back to the sender. In this procedure, the device under test needs only to be accessed at one end.

Also relevant to the art of testing electrical circuit boards using boundary scan techniques are the following references:

R. W. Bassett et al., "Boundary-Scan Design Principles for Efficient LSSD ASIC Testing", *IBM Journal of Research and Development*, vol. 34, no. 2/3, March/May 1990, pp. 339-354.

Dirk van de Lagemaat and Harry Blecker, "Testing a Board with Boundary Scan", *Proceedings of the 1987 International Test Conference*, pp. 724-730.

Colin Maunder and Frans Beenker, "Boundary-Scan: A Framework for Structural Design-for-Test", *Proceedings of the 1987 International Test Conference*, pp. 714-723.

Paul T. Wagner, "Interconnect Testing with Boundary Scan", *Proceedings of the 1987 International Test Conference*, pp. 52-57.

In the patented literature, U.S. Pat. No. 4,991,174 to Mori et al. discloses a fault diagnostic distributed processing method and system. Mori et al. are primarily concerned with fault detection and isolation in distributed systems and, therefore, is not directly applicable to the problem solved by the subject invention. One major difference is the matter of time-out. In the Mori et al. patent, the tester has to wait a period of time (i.e., it has to time-out) before it realizes that there is a problem. This approach is not suitable to efficient printed circuit board testing.

The location of opens and shorts on a PCB or card is a difficult task when a bed-of-nails test cannot be easily performed. The need for such a testing mechanism arises, first, during laboratory debugging and, second, during field test. The testing for opens and shorts is needed during laboratory debugging when the card manufacturing process has not been completely established and is still unreliable. It is also needed during debugging when engineering changes are made. These changes have the potential of adversely affecting the card networks (e.g., solder bridges may be accidently made or networks accidently cut). In the field, when a card defect is suspected of causing a system malfunction, a means for testing for opens and shorts without a bed-of-nails tester is also required.

The echoregister circuit of Gruetzner allows testing where pins would normally be inaccessible. However, the echoregister does not return responses sequentially so that multi-drop nets cannot be tested. The walking sequence proposed by Hassan et al. provides the sequential response lacking with the echoregister circuit, but this approach does not allow the testing of multiple pins at system speed; rather, the test is performed at service clock speed. In addition, while both approaches provide a good level of confidence in the test results, better fault isolation than either can provide is desired.

SUMMARY OF THE INVENTION

It is therefore an object of the present invention to provide a method and apparatus which facilitate the testing for opens and shorts on a subset of networks on a printed circuit board.

It is a further object of the invention to provide a test circuit which provides improved fault isolation in a network of field programmable gate arrays (FPGAs).

It is yet another object of the invention to provide a net test circuit having better performance than conventional techniques because a majority of testing is conducted at system speed rather than at service clock speed.

According to the invention, there is provided a circuit to test for and locate opens and shorts on card networks of field programmable gate arrays (FPGAs). FPGAs are reconfigurable logic arrays which combine the logic integration of custom very large scale integrated (VLSI) circuits with user programmability. The invention uses the programmability of the FPGAs to load "master" and, for some applications, "slave" logic designs into the chips on the card.

The pins on a particular FPGA chip being tested are connected by two rings. One, called the Test Pin Ring, is unique to the chip under test, although it may circle through one or more other chips or even all the chips on a card. The second ring, called the Transmit Chip Ring, circles through each FPGA chip on the card including the chip under test. The two rings, however, are otherwise independent of one another. At any given time, the Test Pin Ring is only activated for one pin-under-test (PUT) via current "master" logic. If the Test Pin Ring circles through all of the chips, all of the pins could have "master" logic, and down-loading and readback would only have to be done once. This greatly reduces testing time.

The Transmit Chip token winds its way through all of the chips and eventually returns to the PUT. When the PUT receives the token, the next pin on the Test Pin Ring becomes the pin-under-test, and the process is repeated.

Each of the pins under test has a counter (a three-bit counter in the disclosed embodiment) as part of the "master" logic. This counter counts the number of responses which were received. When the chip is read back, the Net Test program compares the number of responses that were received to the number of responses that were expected to be received. If the numbers differ, an open or a short exists for that network.

When all of the pins to be tested on a chip have been tested, a new set of logic designs must be loaded which test either another set of pins on that chip or a set of pins on another chip. When a logic design is loaded, the first pin on the Test Pin Ring is activated. The PUT transmits a pulse through its driver and then generates a token which begins traveling around the Transmit Chip Ring. When the logic associated with a pin receives the token on the Transmit Chip Ring, it determines whether it received the pulse transmitted by the PUT. If it did, it returns the pulse to the PUT and transmits the token to the next pin on the Transmit Chip Ring.

The circuit employs a boundary scan technique which is similar to the IEEE 1149 standard while the pattern generation and result retrieval mechanism bear resemblance to techniques described in papers presented at the IEEE 1988 International Test Conference by Abu Hassan et al. and by Matthias Gruetzner, supra.

However, because the network test circuit according to the subject invention was developed for field programmable gate arrays (FPGAs), it has several important advantages over the prior art. The first and most important advantage between the network tester of the present invention and the prior art is improved fault isolation. Because all pins in the network test circuit are bi-directional, only one pin drives the network at any given time. Once this pin has driven the network and the results have been collected, other pins on the network are tested, including the "input" pins. By comparing results, fault isolation is provided.

The second advantage of the network test circuit of the subject invention is better performance than can be obtained in the prior art because a majority of testing is conducted at system speed rather than at service speed. In the network test circuit of the invention, both the pattern generation and the result gathering are self-propelled and can be run at system speed. Also, the net test circuit can test multiple pins at system speed before a service speed readback is required. The ability to test multiple pins during one test means that the network test circuit will have a better performance than normal boundary scan techniques. The network test circuit according to the invention is able to test multiple pins because it uses an "echo" technique like that of the echoregister described by Abu Hassan et al., supra, but unlike the echoregister, the network test circuit's responses return sequentially, allowing the test of multi-drop networks.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

In a specific implementation of the invention, which constitutes a preferred embodiment, reconfigurable logic devices in the form of field programmable gate arrays (FPGAs), such as those manufactured by Xilinx, Inc., of San Jose, Calif., are mounted on printed circuit boards (PCBs), and it is the networks created by these arrays that require testing. FPGAs combine the logic integration of custom very large scale integrated (VLSI) circuits with user programmability which are being increasingly used in prototyping and quick-turnaround design processes. AT&T is currently a second source for the Xilinx FPGAs.

The Xilinx Logic Cell Array (LCA) architecture features three types of user-configurable elements: an interior array of logic blocks, a perimeter of I/O blocks, and programmable interconnection resources. Configuration is established by programming internal static memory cells that determine the logic functions and interconnections.

The FPGA architecture differs from the architecture of programmable logic arrays (PLAs) in two fundamental respects. First, FPGA resources are additive; that is, segments of interconnect can be added to form a path between any two nodes on the device. In contrast, PLA interconnection resources are subtractive; that is, programming of the interconnection patterns consists of removing predefined interconnects to eliminate unused logic. The number of logic levels is predefined, and once an interconnection is removed, the associated logic is no longer available for other functions. Second, FPGA logic building blocks are programmable, allowing them to be configured to perform a wide variety of logic and storage functions. The logic elements of PLAs are fixed, their programmability being limited to the selection of their input signals.

Additional information on Xilinx FPGAs may be had by reference to the booklet entitled "The Field Programmable Gate Array Fact Book: Questions and Answers about the Technology of the 90's" and the article entitled "Taking Advantage of Reconfigurable Logic" by Bradley K. Fawcett in *The Programmable Gate Array Data Book*, both published by Xilinx, Inc., 2100 Logic Drive, San Jose, Calif. 95124. While the subject invention is specifically directed to testing PCBs with Xilinx FPGA nets, it will, of course, be understood that FPGAs manufactured by others may be tested using the techniques and procedures of the present invention.

Figure 1:
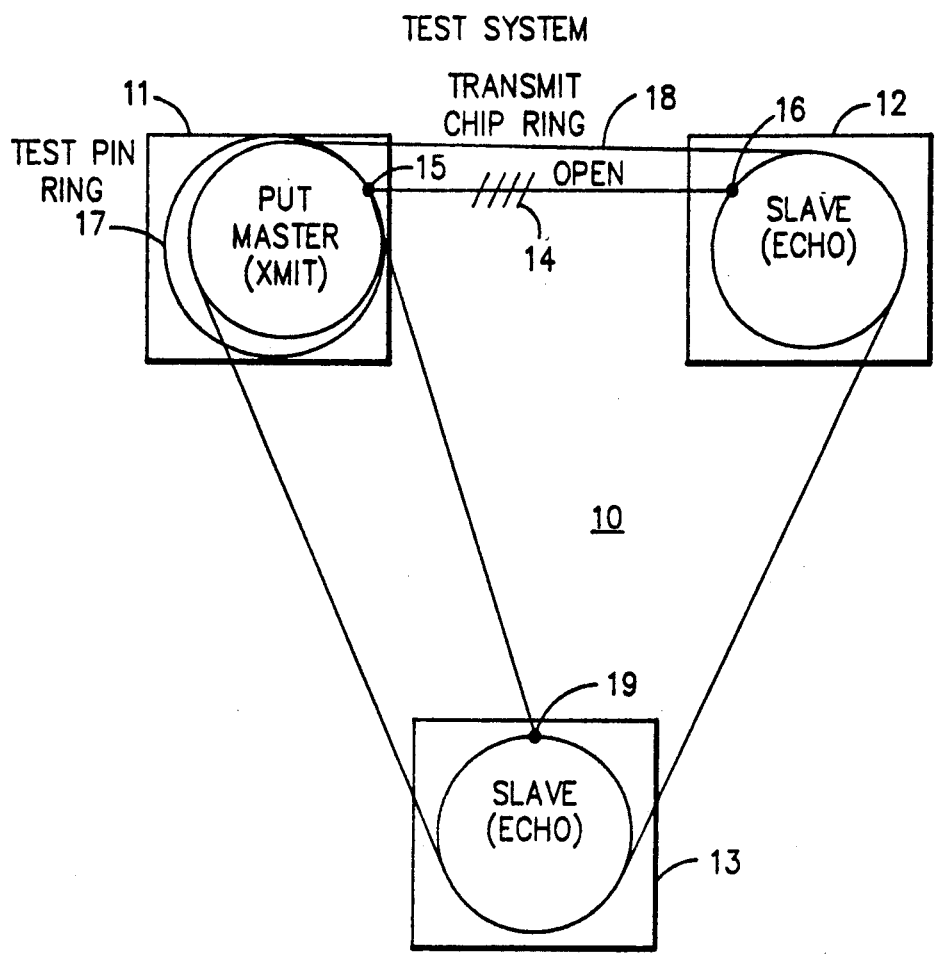
FIG. 1 is a generalized block diagram depicting an illustrative network of FPGAs on a card under test.
Figure 2A:
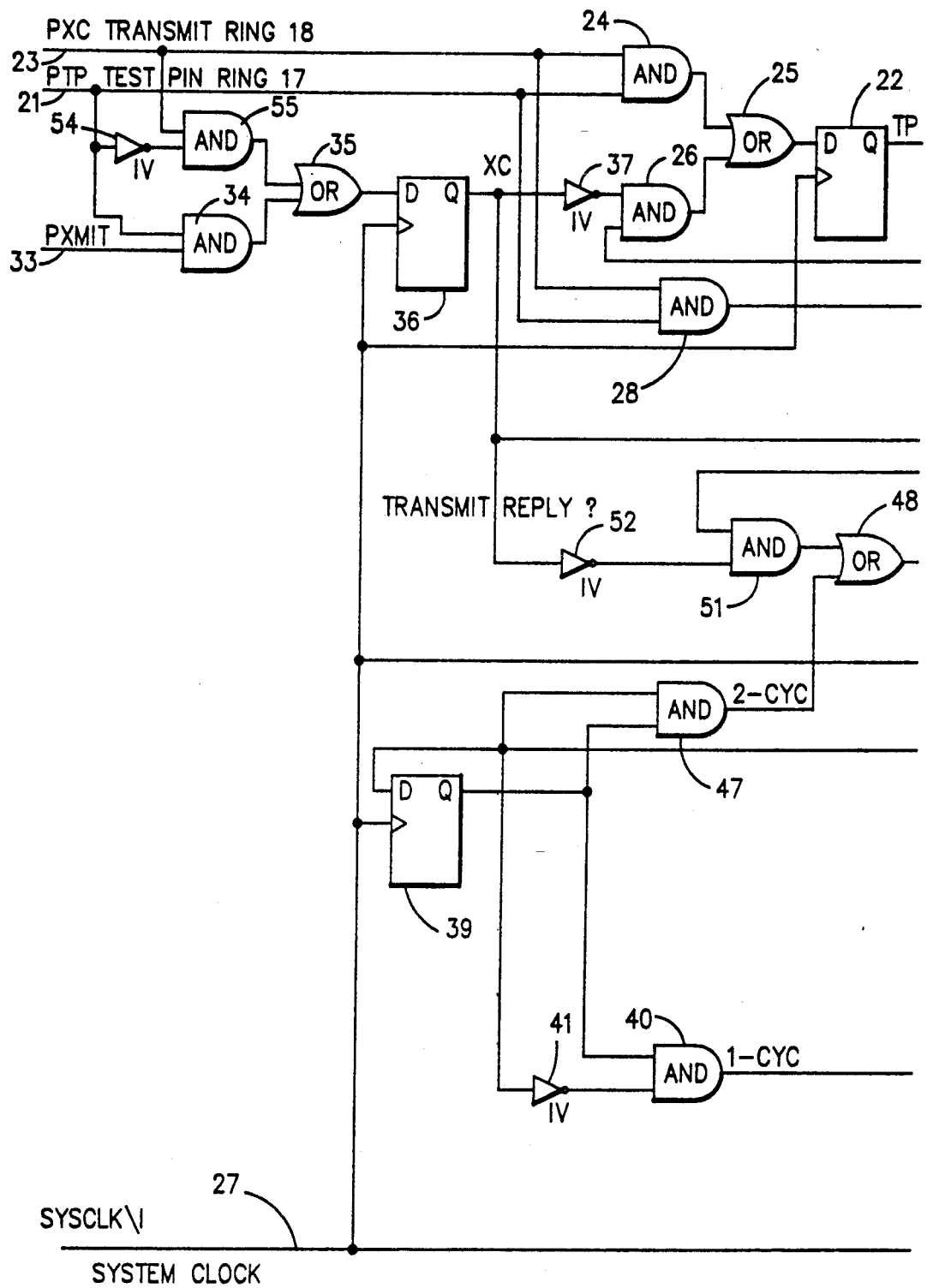
FIG. 2 is a logical diagram of the "master" logic design loaded in an FPGA chip for the pin-under-test (PUT) according to the invention.
Figure 2B:
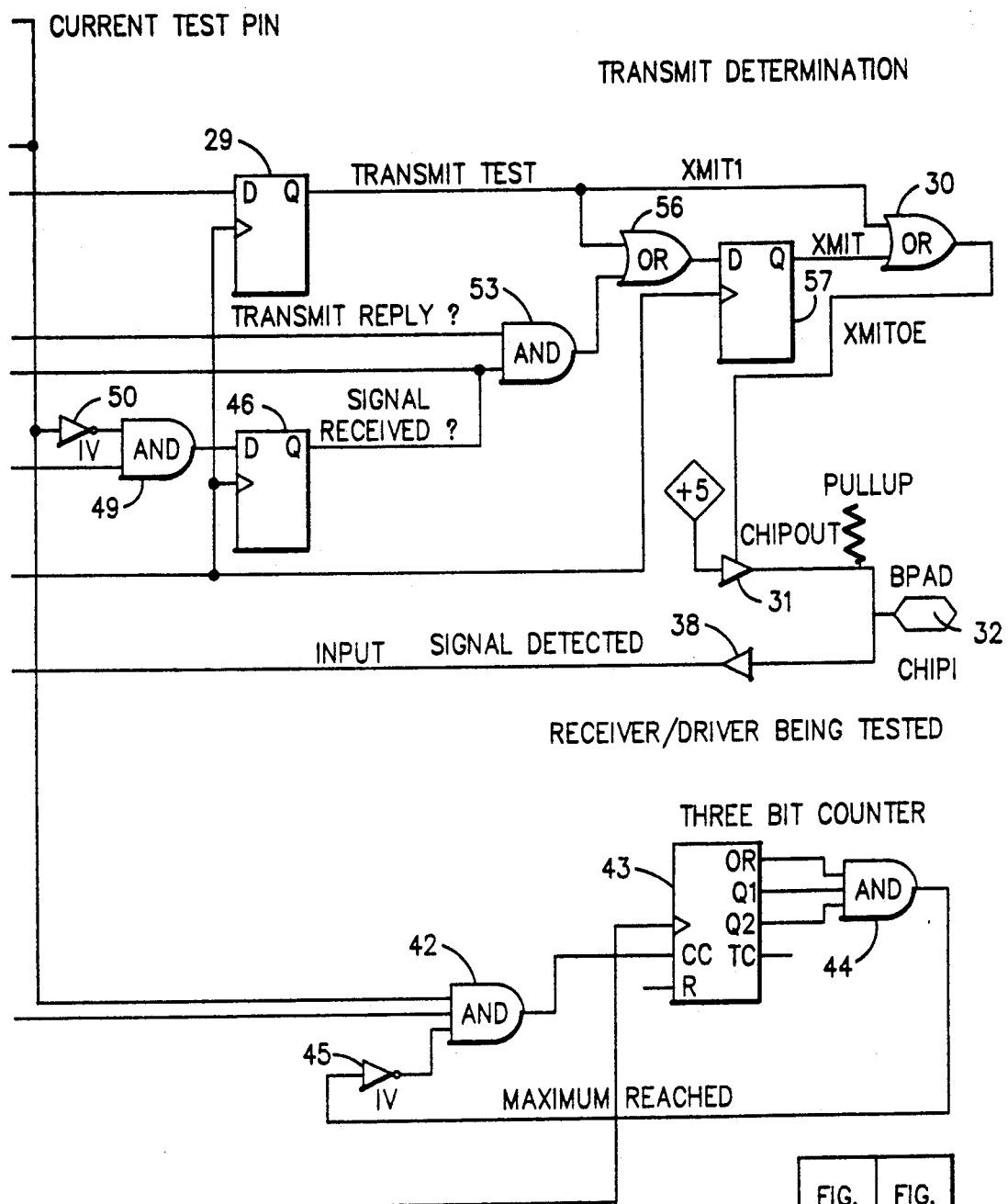
Figure 2:
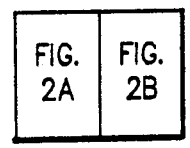
Figure 3:
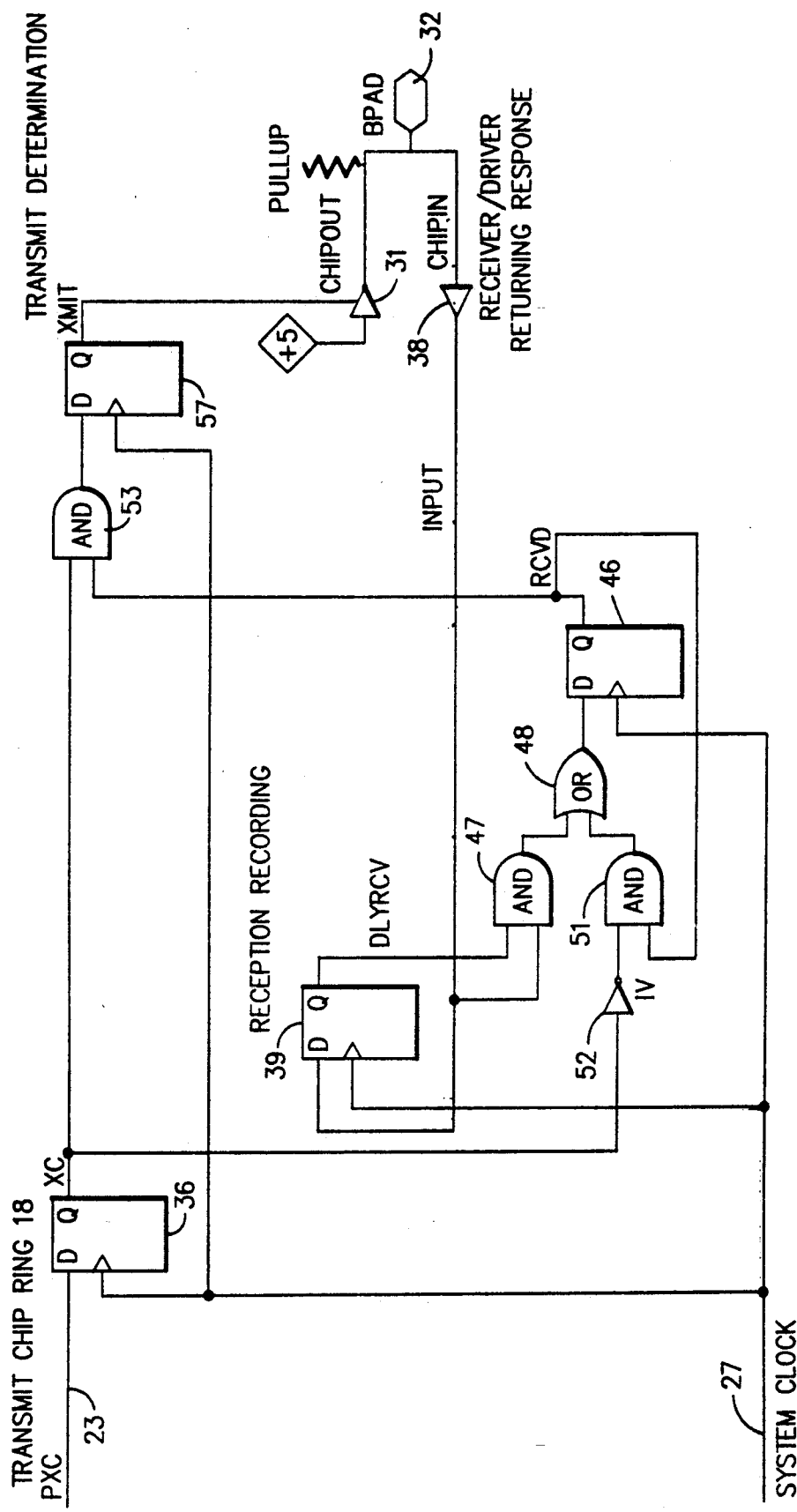
FIG. 3 is a logical diagram of the "slave" logical design loaded in an FPGA chip for a receive pin according to the invention.

Referring now to the drawings, and more particularly to FIG. 1, there is shown a system 10 consisting of three FPGA chips 11, 12 and 13. This system, although simplified, is exemplary of a network (net) of FPGAs on a PCB. The system illustrated in FIG. 1 has an open fault 14, on the net connecting pin 15 of FPGA 11 and pin 16 of FPGA 12. To determine if a fault exists and to locate that fault, the logic configurations shown in FIGS. 2 and 3 is loaded into the three FPGAs in the system 10.

In this configuration, the pins in the chip being tested are connected by two rings. One, the Test Pin Ring 17, is unique to the chip under test. In the illustration, the Test Pin Ring 17 circles through only chip 11, but it should be understood that the Test Pin Ring 17 may circle through more than one of the chips or even all of the chips. In fact, there are certain advantages when the Test Pin Ring 17 circles through all the chips. The second ring, the Transmit Chip Ring 18, circles through each FPGA chips 11, 12 and 13 on the card.

When the configuration is loaded, the first pin on the Test Pin Ring 17 is activated. The pin-under-test (PUT) 15 transmits a pulse through its driver and then generates a token which begins traveling around the Transmit Chip Ring 18. When the logic associated with pin 16 receives the token on the Transmit Chip Ring 18, it determines whether it received the pulse transmitted by the PUT 15. If it did, it returns the pulse to the PUT 15 and transmits the token to the next pin on the Transmit Chip Ring 18. The Transmit Chip Token winds its way through all of the chips and eventually returns to the PUT 15. When the PUT 15 receives the token, the next pin on the Test Pin Ring 18 becomes the pin-under-test, and the process is repeated.

As described in more detail with reference to FIG. 2, each of the pins under test has "master" logic that includes a counter, a three-bit counter in the illustrative and preferred embodiment. This counter counts the number of responses which were received. When the chip is read back, the number of responses that were received is compared to the number of responses that were expected to be received. If the numbers differ, an open or short exists for that network.

In the example shown in FIG. 1, the count read back from the pin 15 would be one less than expected. This difference would indicate that one of the nets attached to pin 15 had an open. Further applications in which pins of the second and third chips 12 and 13 are the pins-under-test would show that pin 16 also has a deficit count but that pin 19 on FPGA chip 13 does not. Thus, by comparing the retrieved counts, the open fault 14 could be located on the net between pin 15 and pin 16.

FIG. 2 shows that "master" logic that is replicated for each pin that is being tested. As will become apparent from the description of FIG. 3, infra, the "master" logic contains a version of the "slave" logic so that it can respond to any initial pulses that it might receive. In addition, the "master" logic contains the control logic necessary for transmitting the initial pulse and for counting the responses.

The "master" logic is connected to the Test Pin Ring 17 via the signal PTP (previous test pin) applied to terminal 21. The PTP signal is the previous pin's (i.e., previous pin in Test Pin Ring 17) equivalent to this pin's TP (test pin) signal at the output of latch 22. When the PTP signal is active and when a pulse is received on the Transmit Chip Ring 18 at terminal 23, AND gate 24 passes the received pulse via OR gate 25 to set the latch 22. This causes the TP transmit test signal to be generated. The TP signal is fed back via AND gate 26 and OR gate 25 to hold the latch 22 in its latched state, preventing it from being reset by the system clock on terminal 27. The latch 22 is held in the latched state until the pin-under-test (PUT) receives the transmit chip token. The PUT will not receive the transmit chip token until that token has passed completely around the Transmit Chip Ring 18 and has returned to the PUT. Therefore, latch 22 will remain set for the full duration of the test for this pin. When the transmit chip token is received, latch 36 will be set, as described infra. The XC output from latch 36 is inverted by inverter 37 to disable AND gate 26. The disabling of AND gate 26 causes the disabling of latch 22 because AND gate 24 is not active at this time.

The PTP signal on terminal 21 and the pulse received on terminal 23 are also passed by AND gate 28 to latch 29. The output of latch 29 is passed to OR gate 30, generating the first cycle in the two-cycle transmit enable signal. The output of the latch 29 is also sent via OR gate 56 to latch 57. Latch 57 delays the signal one cycle, then passes it to OR gate 30, creating the second cycle of the two-cycle transmit enable signal. The transmit enable signal enables three-state buffer driver 31 to generate a test signal on terminal 32 to the card interconnect. The transmit test signal must be generated for more than one cycle so that the slave logic can distinguish it from the echo responses. In this implementation, a two-cycle pulse was chosen. However, if two echo responses are generated one cycle after another, they might appear like the test pulse. Therefore, a three-cycle or four-cycle pulse may be more desirable. A three or four-cycle pulse can be generated by adding more delay latches and ORing the outputs of those latches together.

Once the test pulse has been sent by the PUT through its pin to the card network connected to it, its "master" logic starts a token around the Transmit Chip Ring 18. This pulse is generated when the "master" logic for the current PUT generates the transmit enable signal to the output of latch 57. The next pin knows that the previous pin just transmitted a pulse because the PXMIT terminal 33 is equivalent to the previous pin's output of latch 57. The PTP signal on terminal 21 enables AND gate 34 which passes the received PXMIT signal on terminal 33 to OR gate 35, setting latch 36.

As the token travels around the Transmit Chip Ring 18, the other pins will generate a one-cycle response if they received the original test pulse. The "master" logic of the PUT receives the one-cycle response pulse at terminal 32 and passes the pulse via buffer 38 to set latch 39. Latch 39 enables AND gate 40. If, during the next clock cycle, latch 39 is enabled and the output of buffer 38 is inactive, a one-cycle echo response has been detected and AND gate 40 outputs a logical "1" to AND gate 42. AND gate 42 was previously enabled by the TP signal output by latch 22 and, therefore, AND gate 42 increments the three-bit binary counter 43. The counter 43 will increment until the maximum value, seven, is reached. Once seven responses are received by the "master" logic, this condition is decoded by AND gate 44 which feeds back a logical "1" to inverter 45 to disable AND gate 42, thereby stopping the incrementing of counter 43. In other implementations, more bits may be added to counter 43. Also, the counter need not stop when a full count is received. Rather, it could reset and continue counting or just reset and stop. During the FPGA chip's readback, a count of the number of responses received will be retrieved from the counter 43.

If a pin, either one which has the "master" logic or one which has the "slave" logic, receives the two-cycle test signal transmitted by the PUT, the latch 46 is set. Latch 46 is set by the logic comprising AND gate 47 and latch 39. When the logic receives the two-cycle test pulse at terminal 32, the pulse is passed via buffer 38 to latch 39. Latch 39 enables AND gate 47. If, during the next clock cycle, latch 39 is enabled and the output of buffer 38 is active, then a two-cycle pulse has been received, and the output of AND gate 47 is a logical "1". This signal is passed via OR gate 48 to AND gate 49. If this is not the test pin, that is if AND gate 49 has not been disabled by the output of inverter 50, and if the pin has just received a two-cycle pulse, indicated by AND gate 47, the latch 46 is set. The output of latch 46 is fed back to AND gate 51. AND gate 51 is enabled until this pin, which is not the PUT, receives the transmit chip token, as described infra, indicated by the setting of latch 36. The output of AND gate 51 is fed via OR gate 48 and AND gate 49 to maintain latch 46 in its set condition until the transmit chip token is received.

The transmit chip token is received by the logic in the following manner. If the previous pin is not the PUT (pin-under-test), represented by a logical "0" on the PTP terminal 21, then the inverter 54 causes AND gate 55 to be enabled. When AND gate 55 is enabled and a pulse is received on the PXC terminal 23, then AND gate 55 passes the signal to OR gate 35 which sets the latch 36. Latch 36 will only remain active for one cycle because the token being passed along the Transmit Chip Ring 18 is only one cycle long.

When the transmit chip latch 36 is activated, the inverter 52 causes AND gate 51 to be disabled and, therefore, resets latch 46, as described supra. Also, when the latch 36 is activated, AND gate 53 is enabled. The cycle that AND gate 53 is enabled is the clock cycle before the latch 46 is reset. Therefore, if latch 46 is active, that is if this pin received a test signal from the current PUT, then AND gate 53 passed that signal to OR gate 56 which passes it to latch 57. The signal from latch 57 is transmitted through OR gate 30 to the three-state pin of output buffer 31. The three-state pin is active for one cycle, causing a one-cycle echo response on the output terminal 32.

FIG. 3 shows the "slave" logic which is a subset of the "master" logic shown in FIG. 2 and, therefore, the same reference numerals designate like components in the two figures. The "slave" logic receives the initial test pulse back to the PUT. Unlike the "master" logic, the "slave" logic does not contain the logic necessary to generate a test pulse. The "slave" logic may be used in three places. First, it may be used in the chip which contains the Test Pin Ring 17. It would be used in that chip if there is not enough room for all of the pins to have "master" logic. In this case, the chip which has the Test Pin Ring 17 would have to be tested in several phases, each phase substituting "master" logic for pins which had "slave" logic in the previous phase. Second, "slave" logic would be used in those chips (e.g., 12 and 13 in FIG. 1) which do not contain a Test Pin Ring 17. Finally, although not used in this implementation, "slave" logic could be used on those FPGA chip pins which do not strictly have FPGA-to-FPGA connections. These connections might be FPGA-to-RAM, FPGA-to-converter, and the like. Using the "slave" logic at these pins allows the test to detect, but not necessarily locate, FPGA-to-non-FPGA opens or shorts. If there exists a path such that the Test Pin Ring 17 can circle through all of the FPGA chips, like the Transmit Chip Ring 18, there may be no need for the "slave" logic at all since each pin could have its own "master" logic.

The "slave" logic is connected to the Transmit Chip Ring 18 via the PXC signal applied to terminal 23. The PXC signal is the previous pin's (i.e., the previous pin in the Transmit Chip Ring 18) equivalent to this pin's XMIT signal at the output of latch 57. When the one-cycle Transmit Chip Token is received on terminal 23, the XC latch 36 is set. Latch 36 will only remain active for one cycle because the token being passed along the Transmit Chip Ring 18 is only one cycle long.

If the pin receives the two-cycle test signal transmitted by the PUT, the latch 46 is set. Latch 46 is set by the logic comprising AND gate 47 and latch 39. When the logic receives the two-cycle response pulse at terminal 32, the pulse is passed via buffer 38 to latch 39. Latch 39 enables AND gate 47. If, during the next clock cycle, latch 39 is enabled and the output of buffer 38 is active, then a two-cycle pulse has been received and the output of AND gate 47 is a logical "1". This signal is passed via OR gate 48, and latch 46 is set. The output of latch 46 is fed back to AND gate 51. AND gate 51 is enabled until this pin receives the transmit chip token, indicated by the setting of latch 36 as explained supra. The output of latch 36 is fed back to AND gate 51. The output of AND gate 51 is, in turn, fed via OR gate 48 to latch 46 to maintain latch 46 in its set condition until the transmit chip token is received.

When the transmit chip latch 36 is activated, the inverter 52 causes AND gate 51 to be disabled and therefore resets latch 46. Also, when the latch 36 is activated, AND gate 53 is enabled. The cycle that AND gate 53 is enabled is the clock cycle before latch 46 is reset. Therefore, if latch 46 is active, that is if this pin received a test signal from the current PUT, then AND gate 53 passes that signal to latch 57. The signal from latch 57 is transmitted to the three-state pin of output buffer 31. The three-state pin is active for one cycle, causing a one-cycle echo response on the output terminal 32.

Figure 4:
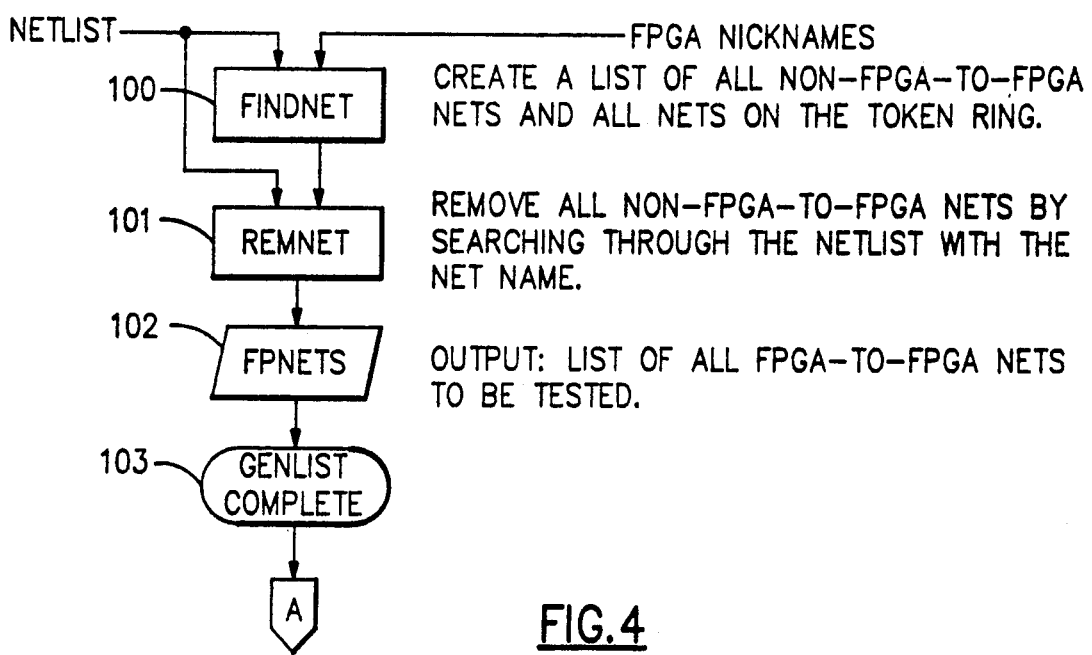
FIG. 4 is a flow chart showing the process of the GENLIST program that generates an input list of nets which are to be tested.

Referring now to FIG. 4, there is shown a flow chart of the GENLIST program that generates a list of nets which are to be tested. This program comprises a series of three listing routines, the first of which, FINDNET, denoted by block 100, creates a list of all non-FPGA nets and all nets on the token ring. FINDNET receives as inputs the net list containing all nets and FPGA nicknames. An FPGA nickname is the identification of the individual FPGA in the system and may be specified by the user. It could be any alphanumeric sequence as long as the sequence for each FPGA in the system is unique.

The net list is also provided as an input to block 101, REMNET, which removes all non-FPGA nets listed by FINDNET 100 by searching through the net list with the net name. The output of REMNET 101 is output to FPNETS 102 which outputs a list of all FPGA-to-FPGA nets that are to be tested, and the process is complete at 103. This list is then passed to the main program shown in the flow chart of FIGS. 5A to 5H, to which reference is now made, as indicated by the connector A.

The output of FPNETS 102 is input to TABLEIZE block 104 which sorts the net list into a table, by chip. Each one hundred units of the table is associated with one chip, limiting, in this implementation, the number of testable pins per chip to one hundred. The output 105 is a tableized version of net list.

Figure 6:
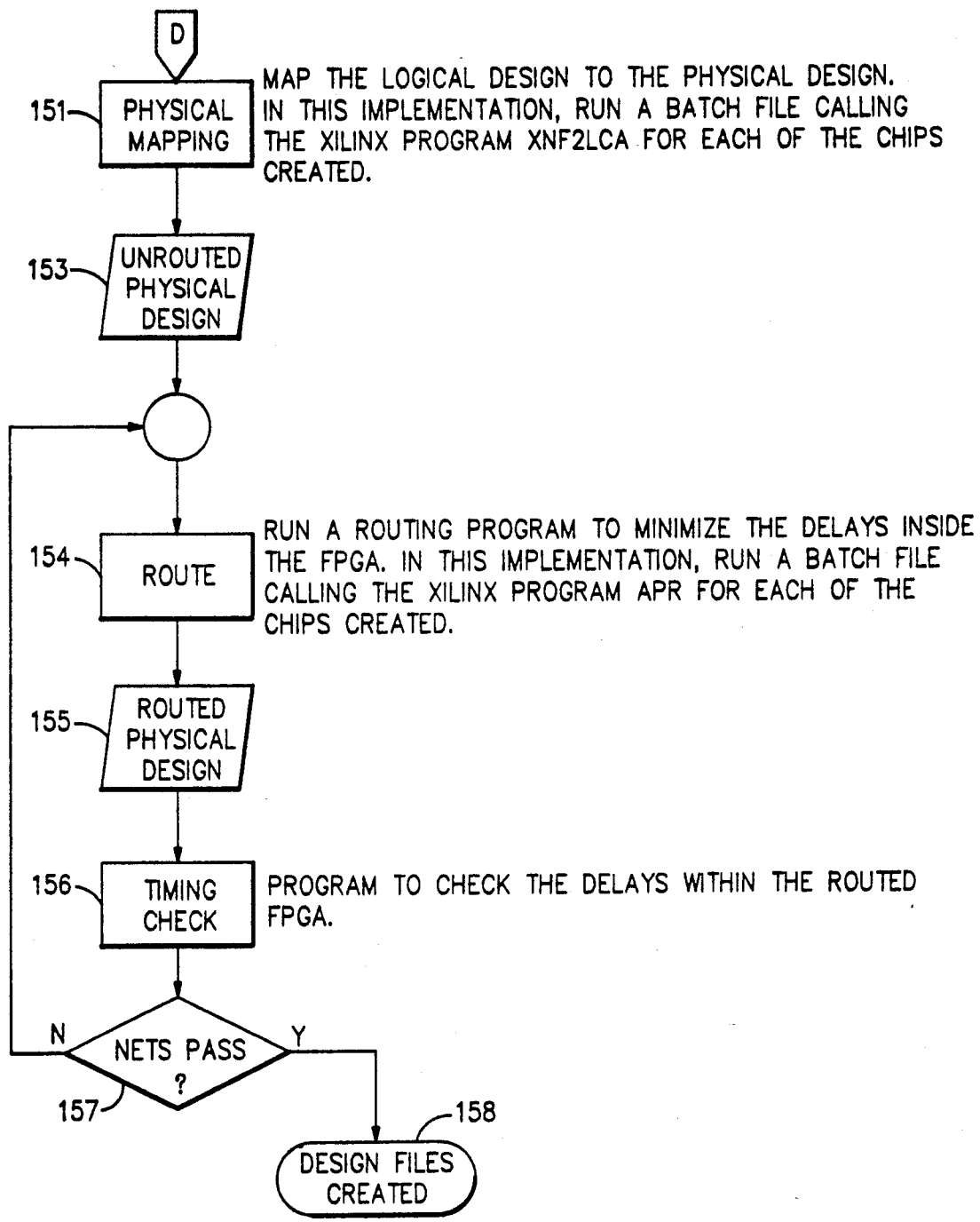
FIG. 6 is a flow chart illustrating the physical design process according to the invention.

In addition to a tableized version of the net list, the main program also needs some physical design information so as to ease intra-chip routing in later steps (i.e., ROUTE 126 in FIG. 6). In this implementation, FILLMAP 106 loads a mapping of the logic blocks into a table 107. In other implementations, FILLMAP 106 can be used to load whatever physical design information is needed for the FPGA being used. Once the initial design information has been loaded into the program, the actual design phase begins. The design phase repeats for each specified FPGA chip in the system until each has the necessary designs completed.

The first step in creating a design is to get the next chip in function block 108 and, since this is a new chip for which the logic has not been completed as determined by decision block 109, a design file is opened in operation block 110. Connector B connects to FIG. 5B, to which reference is now made.

Figure 5A:
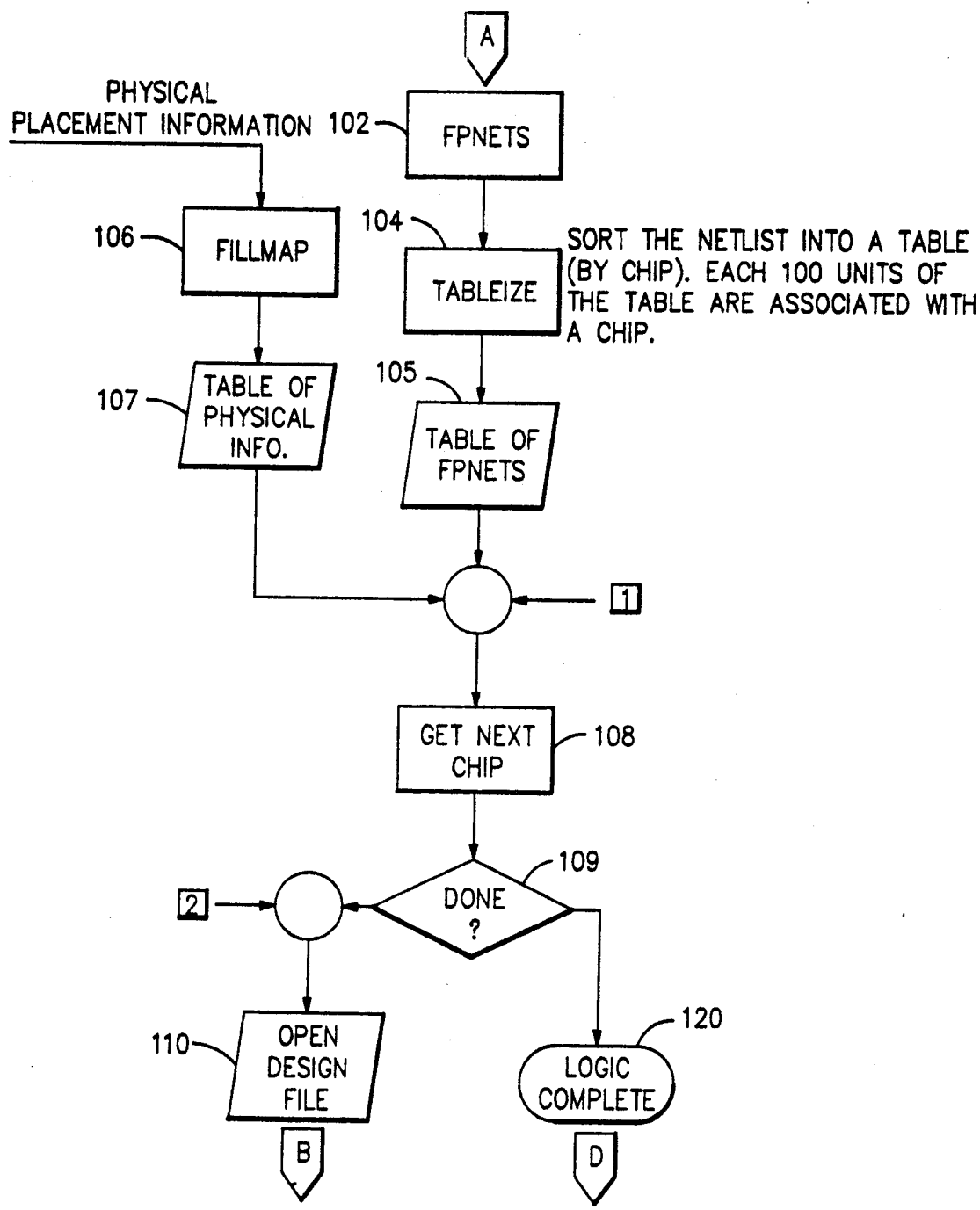
FIGS. 5A to 5H, taken together, are a flow chart showing the process of the MAKEXLF program that is the main program in the net test according to the invention.
Figure 5B:
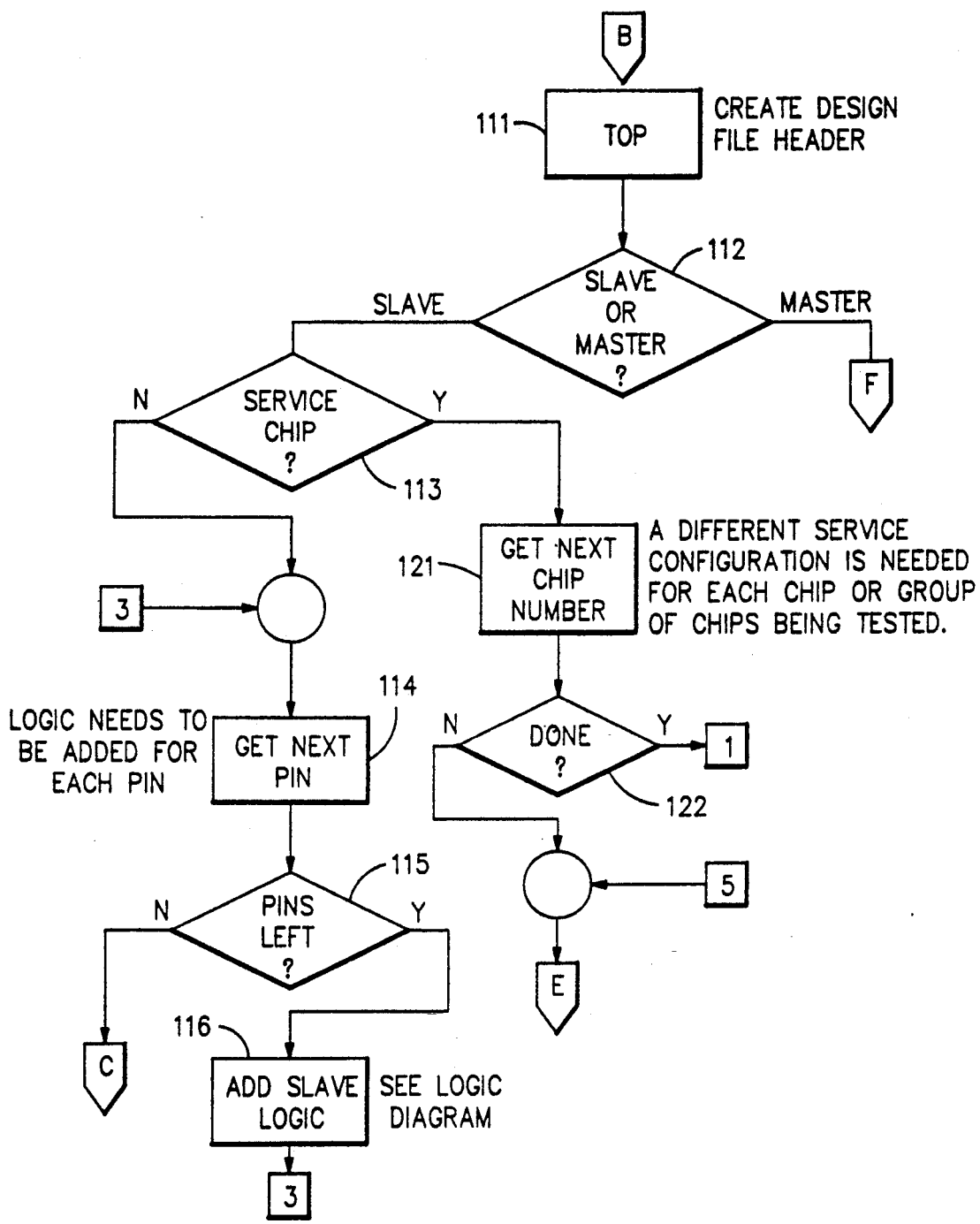

A header, TOP 111 shown in FIG. 5B, which indicates the chip type, the date of creation, etc., is placed in the design file. Since, in this implementation, the Test Pin Ring 17 is confined to one chip and does not wrap through all the FPGAs, two types of designs must be created for each FPGA chip being tested; i.e., the "slave" and "master" chips, as determined by decision block 112. The "slave" chip is the "echo" chip which contains the slave logic, shown in FIG. 3, at each of its pins. The "master" chip is the "control" chip which contains the master logic, shown in FIG. 2, at its pins.

If a "slave" logic design is being created and it is not the service chip, as determined by decision block 113, the next pin for which logic is to be added is selected in function block 114. The service chip, in this implementation, controls the loading and readback of the FPGA chip. A test is made in decision block 115 to determine if any pins are left and, if so, the process 116 of adding slave logic for every pin on the slave chip repeats until no pins are left.

Figure 5C:
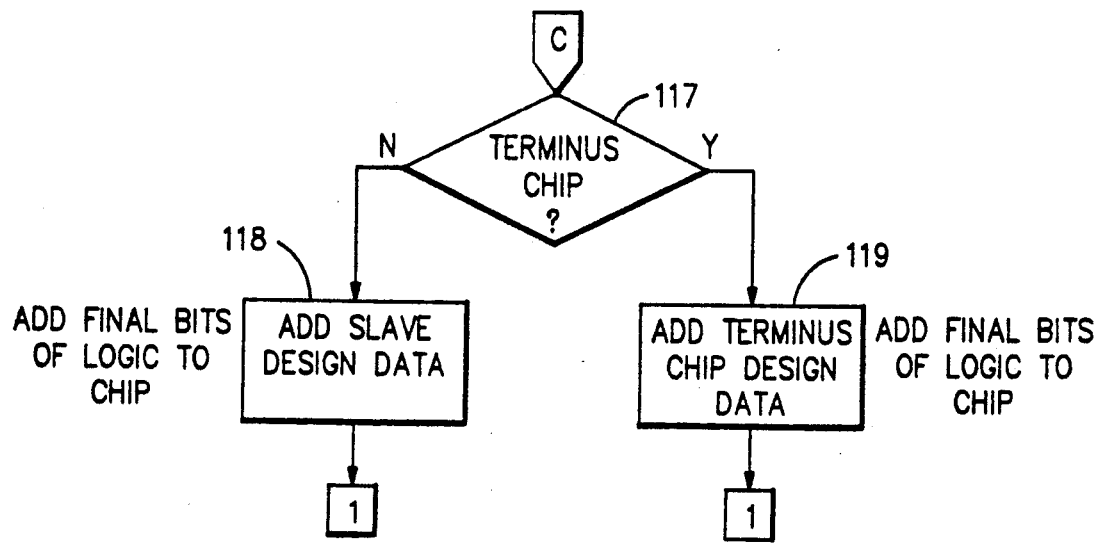

Once slave logic has been added for all of the pins, as determined by decision block 115, the program goes via connector C to FIG. 5C and checks in decision block 117 to see if this is the last chip in the token ring. If it is not, the final slave logic is added to the design at function block 118. The final slave logic includes all the logic that is not repeated for each pin, such as the token kick-off logic. If the chip is the terminus chip, as determined by decision block 117, then slightly different logic is added in function block 119. How or if the terminus chip design differs from the other designs depends upon the specific implementation. In either case, the program then loops back to function block 108 in FIG. 5A via connectors 1 to get the next chip. If the design for the last chip has been completed, as determined by decision block 109, the design phase ends at 120, and the process goes to FIG. 6 via connector D.

Returning to FIG. 5B and decision block 113, if a slave logic design for the service chip is being created, a different procedure is followed. In this implementation, a separate service configuration is needed for each chip or group of chips being tested. Therefore, if there are ten FPGA chips in the system, ten separate service configurations need to be developed.

The service slave logic design process follows much the same procedure as the regular slave design process. The next chip number is retrieved in function block 121, and then a test is made in decision block 122 to determine if the design for this chip is done. If so, the process loops back to function block 108 in FIG. 5A via connectors 1; otherwise, the process goes to FIG. 5D via connector E.

Figure 5D:
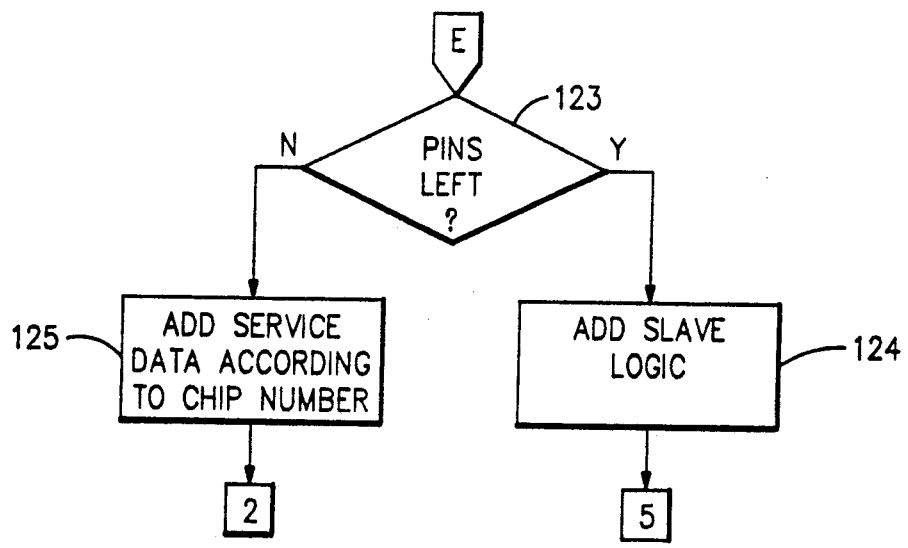

In FIG. 5D, for each pin as detected in decision block 123, the slave logic design is added in function block 124. Control then loops back via connectors 5 and E to decision block 123. When it is determined that there are no more pins left, service data is added at function block 125. This piece includes the readback control logic. Control then loops back via connector 2 to function block 110 in FIG. 5A. Once a service "slave" configuration has been developed for each of the chips being tested as determined in decision block 122, the logic generation procedure returns to function block 108 in FIG. 5A via connector 1 and begins creating another design.

Figures 5E, 5G:
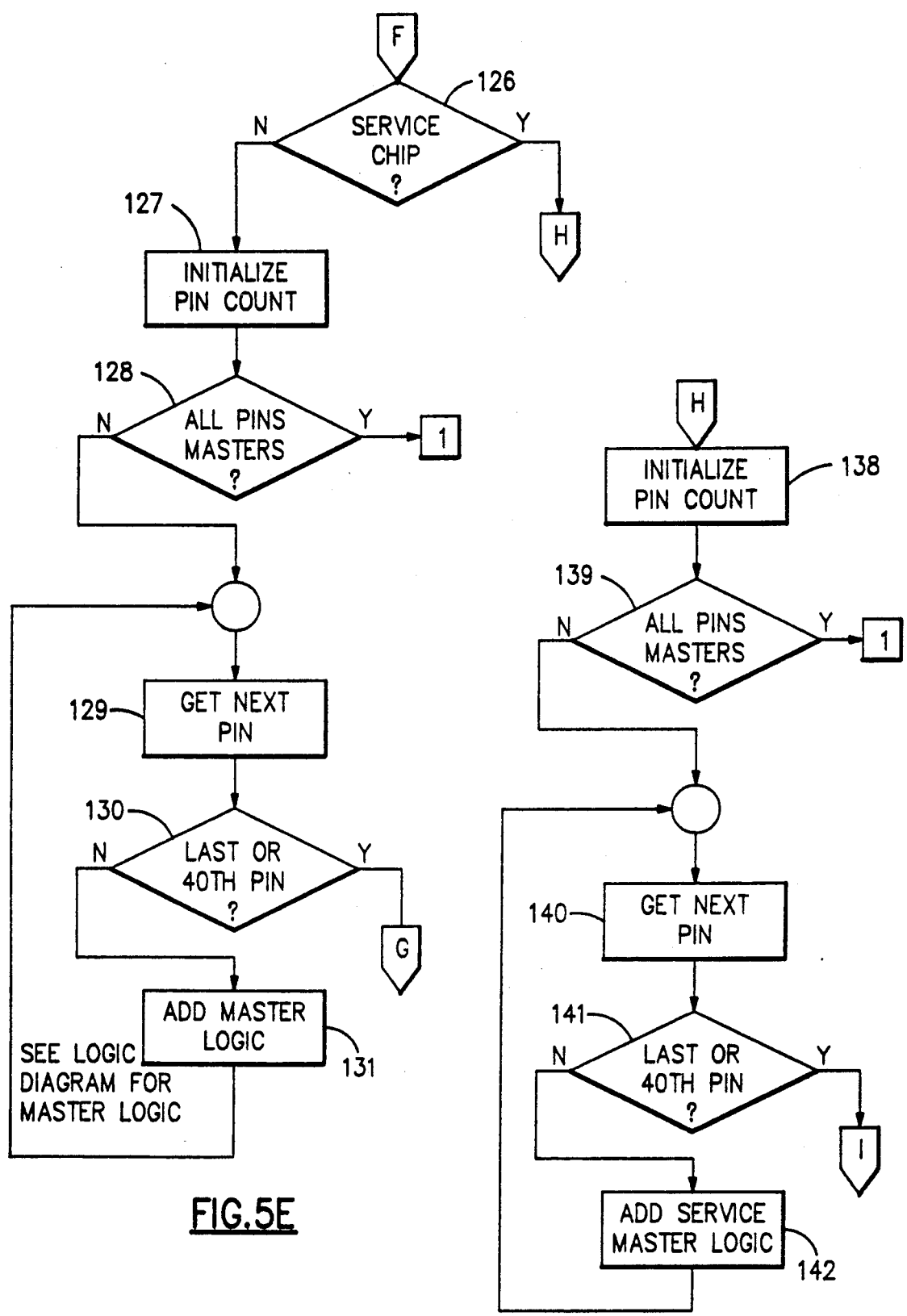

If, in decision block 112 shown in FIG. 5B, a master chip is being designed, control goes via connectors F to FIG. 5E. There a test is made in decision block 126 to determine if this is a service chip, and if it is not a service chip, then a pin count is initialized in function block 127. A test is next made in decision block 128 to determine if all pins are masters. If so, control loops back to function block 108 in FIG. 5A via connectors 1; otherwise, the next pin is retrieved in function block 129.

In an actual implementation, because of the size of the FPGA chips, only forty pins on a FPGA chip can be tested during a single configuration. Thus, if more than forty pins need to be tested, several different configurations will be required. A test is therefore made in decision block 130 to determine if this is the fortieth pin. If so, control goes to FIG. 5F via connectors G; otherwise, for each of the forty master pins in the design, master logic, as shown in FIG. 2, is added at function block 131 in FIG. 5E. The process then loops back to function block 129 to retrieve the next pin.

Figure 5F:
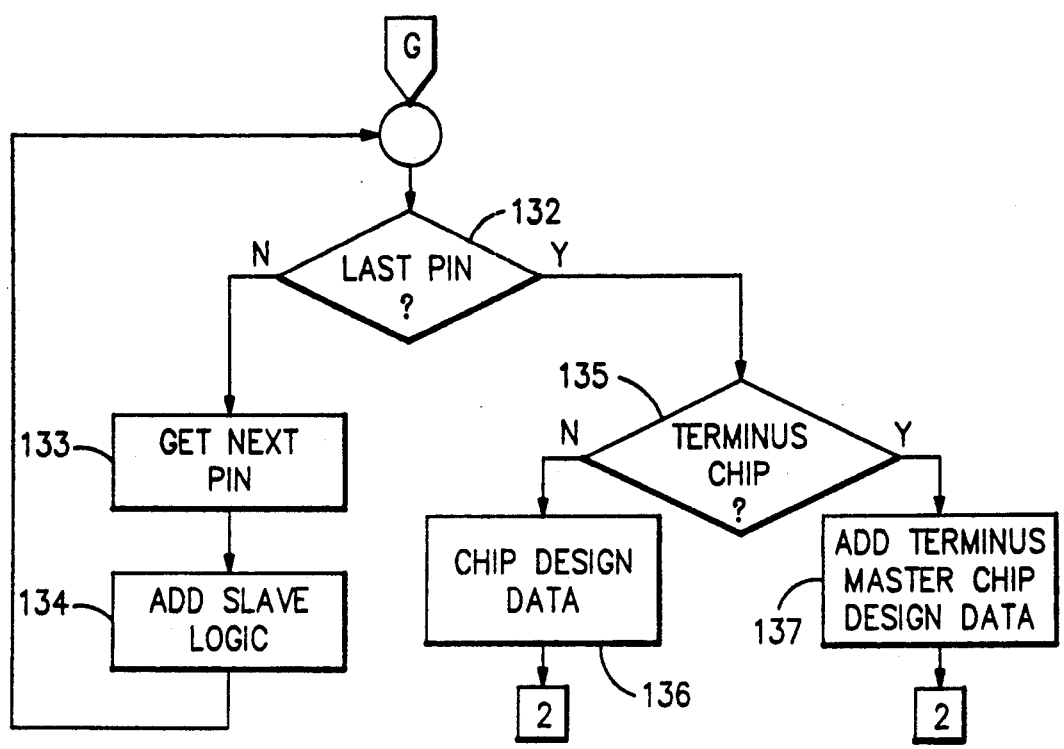

Once forty master pins have been added as determined by decision block 130, slave logic, shown in FIG. 3, is added for the rest of the pins in the FPGA chip as shown in FIG. 5F. More particularly, a test is made in decision block 132 to determine if this is the last pin. If not, the next pin is retrieved in function block 133 and the slave logic is added in function block 134. The process then loops back to decision block 132. Once logic has been added for all the pins in the FPGA chip as determined by decision block 132, a test is made in decision block 135 to determine if the chip is a terminus chip. If the chip is not the terminus chip, the final master chip design data is added in function block 136. If the chip is the terminus chip, a different set of design data may be added in function block 137. In either case, control loops back to function block 110 in FIG. 5A where a new design file is opened.

Referring to FIG. 5E, if the master chip being created is the service chip as determined by decision block 126, then control goes to FIG. 5G via connectors H, and much the same procedure is followed. A pin count is initialized in function block 138, and if all pins are masters as determined in decision block 139, the next pin is retrieved in function block 140. Master logic is added in function block 142 for the pins until the last (or in the example described, the fortieth) pin is reached as determined by decision block 141. Then, control goes to FIG. 5H via connectors I, and slave logic is added for the rest of the pins.

Figure 5H:
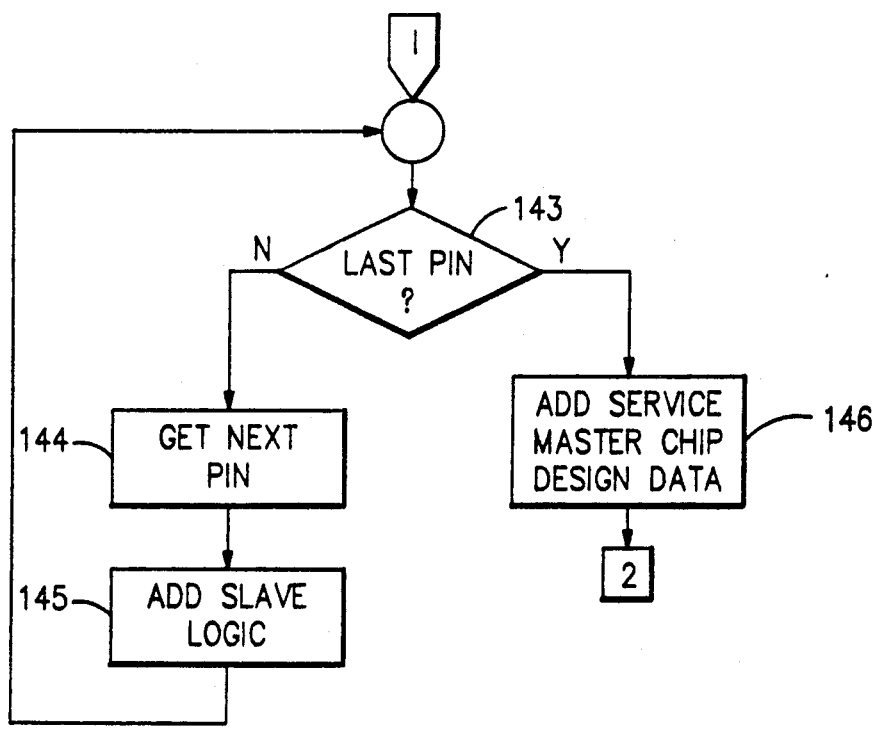

In FIG. 5H, a test is first made in decision block 143 to determine if this is the last pin, and if not, the next pin is retrieved in function block 144 and the slave logic for that pin is added in function block 145. The process loops back to decision block 143 until the last pin is retrieved, at which point the service master chip design data is added at function block 146. Control then loops back to function block 110 via connector 2. This process repeats for until all pins to be tested have "master" logic as determined in decision block 139. The process then loops back to function block 108 in FIG. 5A.

Once all the designs are created, as determined by decision block 109 in FIG. 5A, the physical design process begins. In this implementation, the physical design process, shown in FIG. 6, consists of three steps. The Physical Mapping, represented by block 151, maps the logical design to the physical design. In this implementation, that consists of running a batch file which calls the Xilinx program XNF2LCA for each of the logical designs being created in the chips. XNF2LCA divides the logic created in the design process into a form which can be placed into the FPGA chips. The unrouted physical designs output at 153 by the Physical Mapping process 151 are passed to the routing program 154. The routing program 154 minimizes the network delays between logic inside of an FPGA chip. In this implementation, routing consists of running a batch file that calls the Xilinx program APR for each of the logical designs being created. The output of the routing program 154 are the routed physical designs 155. The routed physical designs are passed to a timing check program 156 which determines if the delays inside of an FPGA chip meet timing requirements; i.e., the delays do not exceed the clock cycle of the particular design being tested. Decision block 157 determines if the chips meet the timing constraints for the overall design. If they do not meet the timing constraints, the routing batch program 154 is run again. If the timing constraints are met, the physical design process is considered complete at 158.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A method for diagnosing interconnecting faults between field programmable gate arrays (FPGAs) connected in a network comprising the steps of:
   forming a first ring interconnecting a plurality of pins to be sequentially tested as a pin-under-test (PUT);
   forming a second ring interconnecting all FPGAs, including the FPGA under test in said network;
   transmitting by the FPGA under test a test pulse from the PUT to all pins of FPGAs connect to said PUT;
   transmitting a token on said second ring by the PUT upon transmitting said test pulse, said token being passed from one FPGA to another in sequence on said second ring;
   echoing by FPGAs receiving said test pulse and said token a report pulse to receiving means on an FPGA under test for receiving an echo of said test pulse;
   receiving echoes of said test pulse by said receiving means on said FPGA under test;
   counting and storing the number of said echoes;
   reading out stored number for each pin tested in said first ring; and
   analyzing said numbers to determine opens and shorts in said interconnections between said FPGAs.

2. The method as recited in claim 1 further comprising the additional subsequent step of upon receiving said token by said FPGA under test, setting a next pin in said first ring to be the pin-under-test.

3. The method as recited in claim 1 further comprising the preliminary steps of:
   programming said FPGAs having pins connected to said first ring with "master" logic capable of transmitting said test pulse and receiving and counting said echoes of said test pulse; and
   programming said FPGAs having pins connected to said second ring but not connected to first ring with "slave" logic capable of receiving said token from a preceding FPGA on said second ring and passing said token to a succeeding FPGA on said second ring.

4. Apparatus for diagnosing interconnection faults between field programmable gate arrays (FPGAs) connected in a network comprising the steps of:
   a first ring interconnecting a plurality of pins to be sequentially tested as a pin-under-test (PUT);
   a second ring interconnecting all FPGAs, including the FPGA under test, in said network;
   first means for transmitting by the FPGA under test a test pulse from the PUT to all pins of FPGAs connect to said PUT;

second means for transmitting a token on said second ring by the PUT upon transmitting said test pulse, said token being passed from one FPGA to another in sequence on said second ring;

echoing means on FPGAs receiving said test pulse and said token for transmitting an echo report pulse of said test pulse to the FPGA under test;

receiving means on an FPGA under test for receiving an echo of said test pulse;

means for counting and storing the number of said echo report pulses received by the FPGA under test;

reading means for reading out stored numbers for each pin tested in said first ring; and analyzing means for analyzing said numbers to determine opens and shorts in said interconnections between said FPGAs.

5. The apparatus for diagnosing interconnection faults recited in claim 4 wherein each of said plurality of pins to be sequentially tested as a pin-under-test (PUT) are programmed with "master" logic including said first and second transmitting means, said echoing means, said receiving means, and said means for counting storing.

6. The apparatus for diagnosing interconnection faults recited in claim 5 wherein pins of FPGAs connected to said second ring but not connected to said first ring are programmed with "slave" logic including said second transmitting means and said echoing means.

* * * * *